United States Patent
Gallet et al.

(10) Patent No.: US 7,080,311 B2
(45) Date of Patent: Jul. 18, 2006

(54) CONVOLUTIONAL CODING AND DECODING METHOD AND SYSTEM

(75) Inventors: Thibault Gallet, Seysses (FR); André Marguinaud, Palaiseau (FR); Brigitte Romann, Rueil-Malmaison (FR)

(73) Assignee: Alcatel, Paris (FR)

( * ) Notice: Subject to any disclaimer, the term of this patent is extended or adjusted under 35 U.S.C. 154(b) by 401 days.

(21) Appl. No.: 10/259,567

(22) Filed: Sep. 30, 2002

(65) Prior Publication Data

US 2004/0216029 A1    Oct. 28, 2004

(30) Foreign Application Priority Data

Oct. 1, 2001    (FR) ................................. 01 12594

(51) Int. Cl.
*H03M 13/03*    (2006.01)

(52) U.S. Cl. ...................... 714/786; 714/761; 714/762; 714/787; 714/788; 714/755; 714/794; 714/795; 375/290; 375/341; 375/262

(58) Field of Classification Search ........ 714/755–762, 714/781, 784, 786–789, 794–795; 375/341, 375/262, 290

See application file for complete search history.

(56) References Cited

U.S. PATENT DOCUMENTS 5,214,672 A * 5/1993 Eyuboglu et al. ............ 375/254
5,375,145 A * 12/1994 Abbott et al. ................ 375/345
5,721,745 A 2/1998 Hladik et al.
6,456,608 B1 * 9/2002 Lomp ........................ 370/335
6,631,488 B1 * 10/2003 Stambaugh et al. ......... 714/746
6,710,814 B1 * 3/2004 Ueno et al. .................. 348/500

FOREIGN PATENT DOCUMENTS

EP    0 982 866 A1    3/2000

OTHER PUBLICATIONS

Sason et al. 'On improved bounds on the decoding error probability of block codes over interleaved fading channels, with applications to turbo-like codes;' Information Theory, IEEE Transactions on , vol. 47 , Issue: 6, Sep. 2001.*

* cited by examiner

*Primary Examiner*—Guy J. Lamarre
(74) *Attorney, Agent, or Firm*—Sughrue Mion, PLLC (57) ABSTRACT

A method of transmitting convolutionally encoded data with separate, independent and looped encoding over at least one data portion. The data is distributed over one or more cycles, and a plurality of cycles can be grouped into packets for discontinuous transmission if necessary. Weighted decoding is effected independently and cycle by cycle: it starts at a robust location, with a relatively high likelihood, and terminates at a weak location, with a weak likelihood, ignoring the concept of time. This limits the size of the packets of errors and prevents the propagation of packets of errors due to scrambling. Independent encoding and decoding of data can be effected without exchanging parameters between cycles and the parameters of each cycle (size, redundancy, constraint length) can be separate. Different degrees of protection and time-delay are permitted as a function of the nature of the data to be transmitted (voice, digital data, signaling, etc.).

34 Claims, 5 Drawing Sheets

Fig.1

PRIOR ART

Fig. 2

PRIOR ART

CONVOLUTIONAL CODING AND DECODING METHOD AND SYSTEM

CROSS-REFERENCE TO RELATED APPLICATIONS

This application is based on French Patent Application No. 01 12 594 filed Oct. 1, 2001, the disclosure of which is hereby incorporated by reference thereto in its entirety, and the priority of which is hereby claimed under 35 U.S.C. §119.

BACKGROUND OF THE INVENTION

1. Field of the Invention

The invention relates to error corrector coding of digital data transmitted in the form of separate packets or a continuous stream. In the context of the invention, various transmission resource access techniques can be envisaged:

transmission of packets: time division multiple access (TDMA) transmission, in which the modulated packets share the same carrier, or frequency hopping transmission, in which the modulated packets change carrier frequency on each frequency hop, continuous transmission: frequency division multiple access (FDMA) transmission, in which data is transmitted continuously on the same carrier frequency, or code division multiplex access (CDMA) transmission, in which continuously transmitted data is spread by a direct sequence PN code, and any technique combining more than one of the above access modes.

The forms of modulation envisaged comprise any type of digital modulation of the data to be transmitted. For example, 4-PSK modulation associates a modulated symbol with each pair of bits and 16 QAM modulation associates a modulated symbol with each quadruplet of bits.

2. Description of the Prior Art

Figure 1:
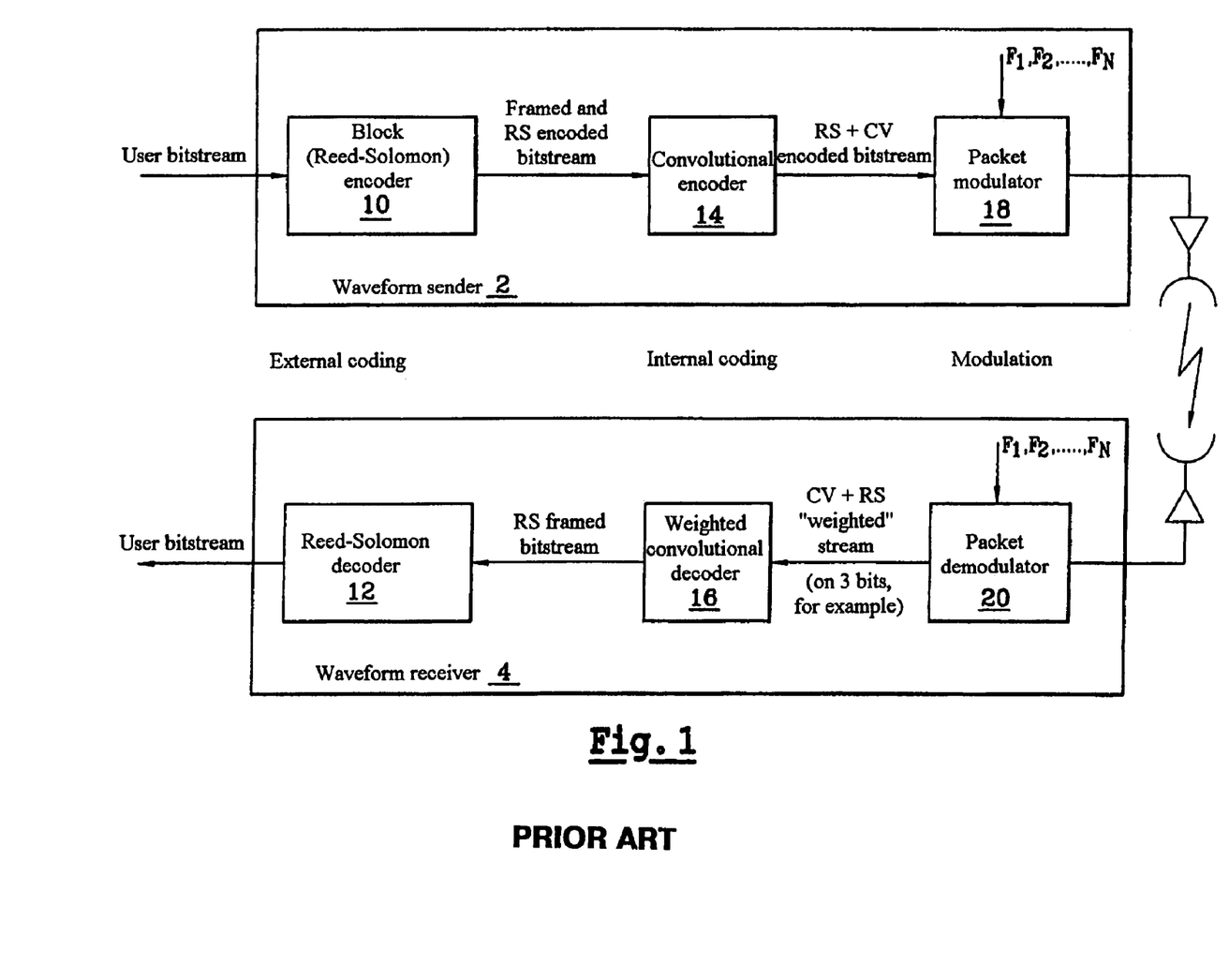
FIG. 1, already described, is a diagram showing frequency hopping transmission between a conventional sender and a conventional receiver.
Figure 2:
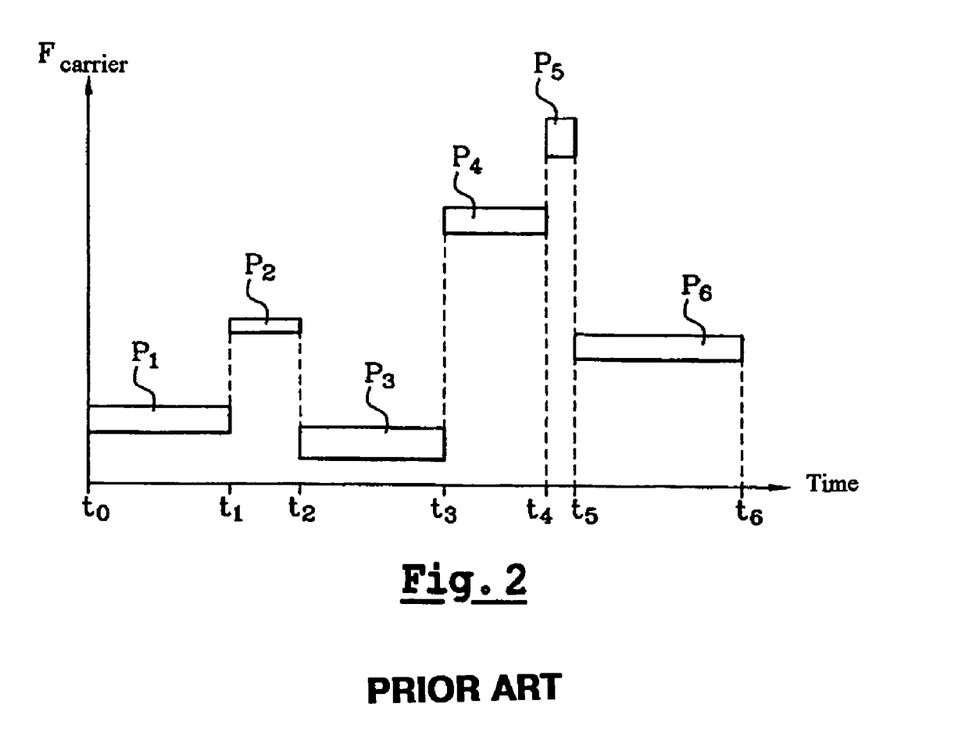
FIG. 2, already described, is a timing diagram for the conventional transmission of packets of data on different carrier frequencies.

FIGS. 1 and 2 show the general principle of frequency hopping digital transmission of packets whereby information is transmitted frequency step by frequency step, each step including a packet of data modulated by a separate carrier frequency ($F_1$, $F_2$, . . . , $F_N$).

FIG. 1 is a block diagram of a system 1 using a conventional frequency hopping transmission channel having a sending part 2 and a receiving part 4.

FIG. 2 shows symbolically the evolution in time of the carrier F of the sending part 2. Note that the sending of data, represented by rectangles, is operative over time intervals that vary from one hop to the next. The range of frequencies occupied by the carrier also varies, over the same time intervals.

All transmission is subject to radio frequency and other interference, both unintentional, including natural receiver noise, operating conditions, industrial noise, selective fading, and intentional, including continuous, impulse or selective scrambling.

To increase the energy efficiency of transmission, allowing for the above effects, error corrector codes are usually employed, with the aim of recovering symbols corrupted by interference. The transmission bit rate is increased to protect the data bits. The number of data bits relative to the total number of bits transmitted is denoted by the ratio R. The redundancy of a code increases in direct proportion to the value of the ratio R.

Two types of coding are usually implemented upstream of the modulator 18, associated with the corresponding two types of decoding downstream of the demodulator 20. The first type of coding, closer to the modulator and referred to as internal coding, generally uses a weighted convolutional code 14 with no framing (also known as an infinite code). The data is encoded by means of sliding control equations. The associated decoding with weighted inputs, also known as soft decoding, generally employs the Viterbi algorithm. The usual redundancies of this type of code (or combinations thereof) are 1/2, 3/4, 1/3, etc.

The second type of coding, referred to as external coding, is generally a Reed-Solomon block (framed) code 10 with "hard" or binary outputs, and reduces or even eliminates residual errors in order to achieve the specified final performance.

Generally speaking, the object of demodulation is to estimate the values of the symbols to be demodulated and to quantify the likelihood thereof by means of a digital value and with relatively coarser or relatively finer quantization, depending on the hardware implementation.

The usual hardware is based on processors and dedicated components. The MODEM function is implemented in one or more components separate from the weighted convolutional code component. As a consequence of this, the weighted data going from the demodulator to the convolutional decoder (for soft decoding) is quantized with a limited number of bits (generally three bits).

A Reed-Solomon (RS) bitstream is obtained at the output of the weighted convolutional decoder and is fed to an RS decoder 12 to obtain a user bitstream at the output.

A prior art convolutional coder 14 with a redundancy R=1/2 uses two polynomials for encoding. The degree (K−1) of the polynomials defines the constraint length K of the code and is reflected in an encoding symbol time-delay.

For example, if two sixth degree polynomials are used when R=1/2, then K=7. If eighth degree polynomials are used, again with R=1/2, then K=9.

If exceeding the correction capacity of the decoder (which is related to the constraint length K of the code) causes the convolutional decoder to eliminate the correct hypothesis, the (slow) return to the good hypothesis leads to bursts of errors of varying duration.

To solve this problem, two error correction approaches are generally proposed with standard convolutional codes:

i) interleaving a plurality of infinite convolutional codes, the effect of which is to disperse the errors over each of the convolutional decoders to reduce the probability of bursts of errors occurring that crash each decoder.

However, this approach complicates the implementation of the system and the interleaving increases the transmission time-delay; in the case of frequency hopping transmission, this necessitates the introduction of an amplitude estimator on each step.

ii) adding bits for dumping the code at the end of each packet. These dumping bits generate a loss of energy efficiency (Eb/NO) that is inversely proportional to the length of the packets transmitted.

The first approach has the drawback that it does not definitively limit the phenomenon of bursts of errors, while the second systematically sacrifices transmission energy efficiency.

Note that decoding the internal convolutional code can produce bursts of errors of varying size, much greater than the durations of the interference that caused them.

In light of all the above, the invention proposes a new approach to coding and decoding this type of code which in particular limits the duration of the bursts of errors at the decoder output, without modifying the usable bit rate or the redundancy R, and maintains the good performance previously achieved with the conventional code.

SUMMARY OF THE INVENTION

To be more precise, a first aspect of the invention proposes a method of convolutionally encoding and/or decoding payload bits, wherein the payload bits are submitted to a system of sliding control equations of finite length, looped on itself.

The encoding can be "separate" encoding, wherein redundant bits and the payload bits are concatenated to constitute output bits.

The invention groups the output bits over one or more looped portions forming one or more respective cycles.

The cycles are advantageously each defined by the following quadruplet of parameters:

the cycle size C (expressed as a number of bits transmitted), the number K of payload bits with which the control system is concerned at any given time, the number K being the constraint length so that (K–1) is the maximum degree of the polynomials associated with the system of control equations, the redundancy R, i.e. the ratio of the number of payload bits to the number of transmitted bits of the cycle, and the coefficients of the equations of the control system.

The cycle parameters can be selected independently from one cycle to another.

The cycles can be encoded independently, even if they belong to the same user set, and are therefore decoded independently, with no exchange of data or parameters between cycles.

The invention groups one or more cycles into separate digital packets in order to service a transmission of packets, if necessary, continuous transmission being a special case of a single packet of arbitrary length. In other words, the invention codes and decodes equally well data in the form of a continuous stream and data in the form of packets.

The invention further adapts the quality of service (cycle loss rate, average error rate and transmission time-delay) to the nature of the data to be processed by adapting the variable parameters of each cycle to the level of encoding and decoding, the quality of service being individualized according to the nature of the data (voice, digital data, signaling, header, etc.).

When the invention is used for encoding, it can comprise a step of scrambling some or all of the transmitted bits of the cycle.

The method can be implemented on one or more processors employing temporal division rather than functional division of the tasks to be carried out, with no passing of data between cycles, the cycles being independent, integrating demodulation and cyclic convolutional decoding in the same processor with reduction of the quantizing loss that can be induced by the data interface between a conventional demodulator and a conventional decoder, implemented in two separate processors, for example.

When the method is used for encoding, it can comprise the successive steps of:

computing the separate impulse response corresponding to the size C of a cycle to be encoded, and encoding the incoming message.

The impulse response is advantageously separate. It is precomputed for each type of cycle and the impulse response, if it exists, is unique.

Cycles of selected sizes are preferably concatenated to prevent non-looping cycle sizes and adjustment to the length of the required message. Accordingly, in the case of a redundancy R=1/2, the multiples $2^{K-1}-1$ do not loop.

In one embodiment, a ratio of data bits to the total number of bits transmitted equal to 1/2 is established, a separate impulse response existing if the size of the cycle is not a multiple of $2^{K-1}-1$, where K is the constraint length.

The encoding preferably employs a separate impulse response computed from a unit message.

The unit message preferably comprises a set of bits of which only one bit has the binary value "1".

The impulse response can be computed using a sequence of redundant bits placed before the start of the unit message, the value of the bits forming the sequence being selected so that, after the impulse response is computed, there is the same sequence of values in the corresponding last bits of the impulse response.

The value of the sequence of redundant bits is advantageously computed by trying all possible combinations of bit values until the sequence of values is obtained in the last redundant bits of the unit message after the impulse response is computed. The possible combinations can be exhausted in a reasonable time.

The encoding can further comprise general encoding of data by rotation and addition of the separate impulse response computed from the unit message.

Each cycle preferably includes a small number of bits, for example from 64 bits to 150 bits for the combination (K=7, R=1/2), in order to minimize the propagation of errors and guarantee resistance to intentional or non-intentional interference.

The invention also provides a method of decoding cyclically coded data, in particular data coded by the above encoding method, wherein, for a given cycle, decoding is started at a robust location with a relatively high likelihood and terminates at a weak location with a weak likelihood, ignoring the direction of the flow of time, the likelihood of the location being computed over a number of symbols proportional at least to the constraint length K.

When the method is used with a single cyclic encoder, the decoding preferably starts at the most robust location and terminates at the weakest location of the cycle to be decoded.

The likelihood of a location is advantageously determined as a function of the quality of the local signal estimated by the upstream unit in the transmission system. If the upstream unit is the demodulator, the quality of the local signal is given by the level of the carrier reconstituted on each demodulated symbol integrated over the duration of the associated decoding hypothesis, for example. If the upstream unit relates to another cyclic convolutional decoder (after parallelizing or concatenating the redundancies of two convolutional encodings thereof), the quality of the local signal is given over the duration of the decoding already effected (expressed as a number of symbols).

The decoding can be started by computing the likelihood of the no-error hypothesis in the chosen robust location as well as the hypotheses having a limited number of errors at the same place.

The decoding can be progressive in two opposite directions to progress on both sides of a weak location, each direction yielding a respective set of hypotheses.

The decoding can be continued demodulated symbol by demodulated symbol toward a weak location by increasing the duration of the likelihood associated with the hypothesis, retaining on each step the hypotheses with the greatest likelihood.

A total hypothesis, chosen as being that which satisfies the equations of the control system step by step throughout the cycle, can be produced from the hypotheses.

The hypothesis retained can be that with the maximum likelihood.

In a second aspect, the invention provides an encoder configured to implement at least one of the encoding methods set forth hereinabove.

In a third aspect, the invention provides a receiver which includes a decoder configured to implement at least one of the decoding methods set forth hereinabove.

The advantages and features of the invention will become more clearly apparent on reading the following description, which is given by way of non-limiting and illustrative example only, and with reference to the accompanying drawings.

DETAILED DESCRIPTION OF THE PREFERRED EMBODIMENTS

Before describing a specific embodiment, general aspects and principles of one embodiment of the invention will be touched upon.

This embodiment exploits the fact that the invention divides a bitstream to be transmitted into signal portions known as cycles, each of which is encoded by means of a system of sliding control equations looped on itself. They are decoded by means of the same system of sliding control equations.

From a hardware point of view, dividing the internal code into cycles smaller than a packet means that the cyclic encoders and decoders can be associated with the packet modem without passing data from one packet to another between the coders/decoders. Thus dividing the tasks to be carried out temporally, rather than functionally, avoids the limitation of the quantization of the symbol likelihoods of the demodulator (for the purposes of soft decoding), which applies if the weighted convolutional decoding component is external to the modem. Only the external code chains the packets received in order to supply them to the end user.

Thus the cyclic structure is directly adapted to the packet access mode by concatenating cycles of appropriate length.

The invention therefore uses packets with no connection between them (i.e. packets that are non-consecutive in time), without backing up the context.

The continuous mode is a particular case of the packet mode where N=1, i.e. the modem sends modulated data continuously on a single carrier frequency F1.

Figure 3:
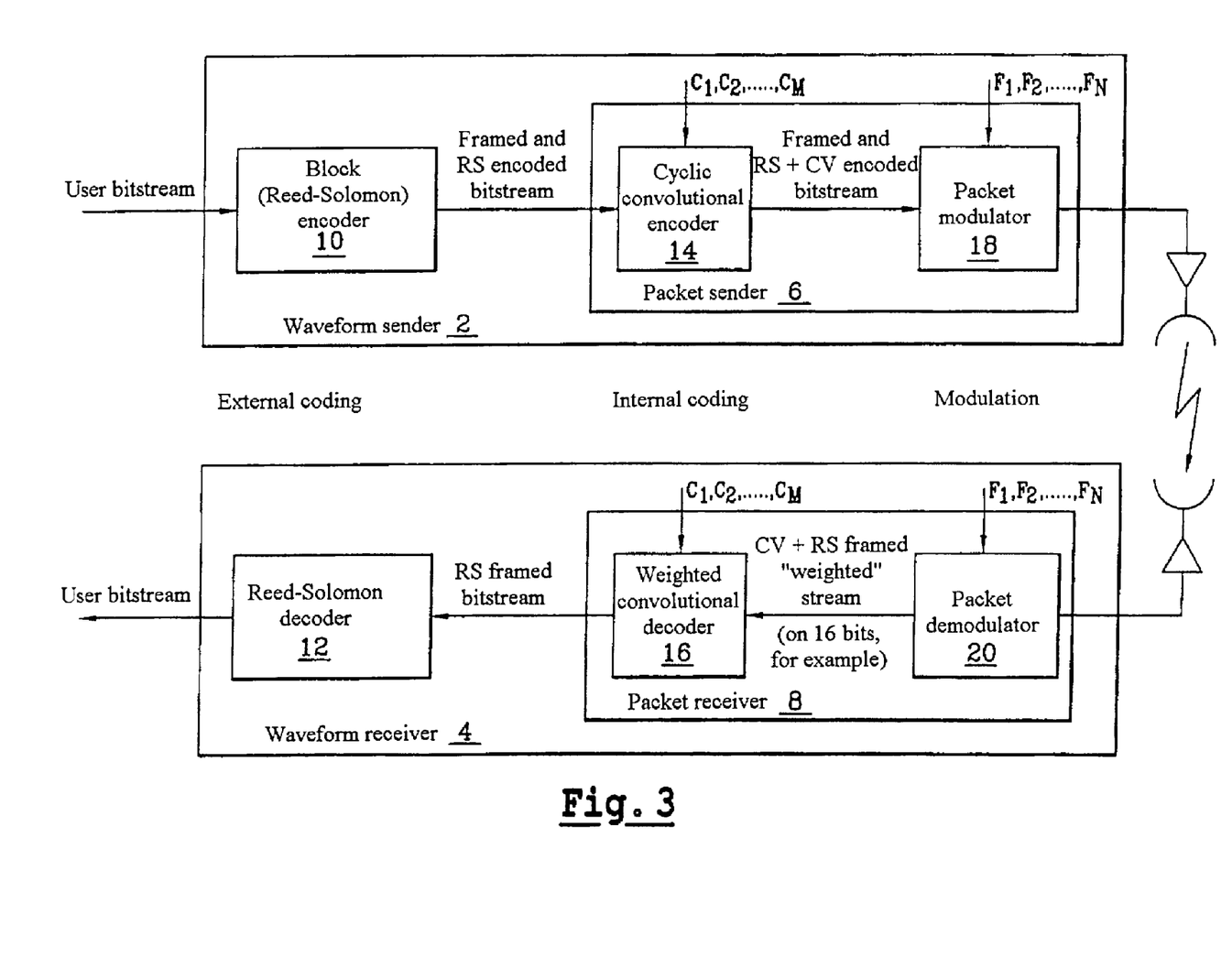
FIG. 3 is a diagram analogous to that of FIG. 1, modified to show the implementation of one embodiment of the invention.

Although in this case the traditional implementation provides only one frame structure on the external code, imposed by the size of the Reed-Solomon block code, in the context of the invention, the continuous stream transmitted by the modem is structured into frames from the internal code stage and by the defined length of the cycles, as shown in FIG. 3.

In this embodiment, encoding is separate, i.e. the redundant bits do not degrade the data bits that are also transmitted to the modulator. The bits transmitted are constituted by concatenating the payload bits and the redundant bits. If necessary, this enables the decoder to "pass" the payload data without correction if an incapacity of the code to be corrected has been detected elsewhere.

Figure 4:
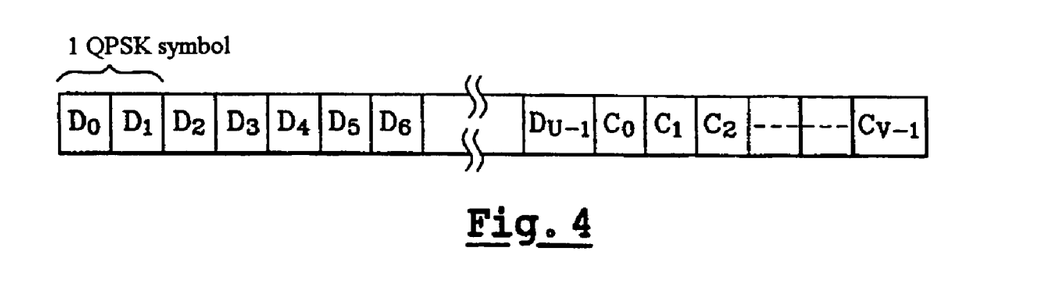
FIG. 4 is a diagram showing one example of the distribution of redundant bits and data bits within a transmitted packet.

Whatever the redundancy R of the code, the manner of incorporating redundant bits into a packet (positioning relative to the data bits, number, etc.) is not unique. For example, FIG. 4 represents one example of the distribution of the redundant bits $C_0, C_1, C_2, \ldots, C_{\nu-1}$ among the data bits $D_0, D_1, D_2, \ldots, D_{\mu-1}$ of a packet. In this example, the data set is separate from the redundant set, so that data symbols can be generated separately from redundant symbols, even after regrouping of the bits by symbols for the purposes of modulation. In FIG. 4, the bits are grouped in pairs on the assumption that the modem uses 4-PSK modulation.

Given the foregoing, the invention proposes an encoding and decoding system which limits the number of decoding errors and prevents their propagation, whilst preserving the theoretical performance and implementation complexity of conventional infinite convolutional encoders and decoders.

Even if they belong to the same transmissions, the cycles are typically encoded independently and therefore decoded independently, with no exchange of data or parameters between cycles. Thus there is no temporal order of decoding and the quadruplets of parameters of each cycle can be different.

Encoding advantageously proceeds in two stages: the first stage computes the separate impulse response of the cycle. That response, when it exists, is unique to each length C and is computed once only for all of the transmission for as long as the polynomials used are retained. The second stage computes the redundancy of each cycle associated with an incoming payload message of length u. This second stage uses the impulse response computed in the first stage and is executed as many times as there are cycles to be encoded.

1) The separate impulse response is the result of concatenating a unit message (MU) of length u and its associated redundancy of length v. The redundant bits (C0, C1, C2, ..., Cv-1) are computed by progressively imposing verification of the control equations, which are mathematical equations defined by conventional generator polynomials. The unit message (MU) consists of a set of bits in which only one bit has the value "1". The other bits have the value "0".

The redundant bits of the separate impulse response can be computed by means of a temporary sequence of redundant bits placed ahead of the beginning of the unit message, the value of the bits forming the redundant sequence being selected so that, after the separate impulse response is computed, the same sequence of values is found in the last redundant bits.

The value of the redundant bits is preferably computed by trying all possible combinations, since in practice the number of combinations is small. The trial and error method is applied until the same sequence of values is obtained in the last bits of the unit message after computing the separate impulse response.

2) The second stage of general encoding looks for the bits at "1" in the binary payload message to be encoded, in order to compute the bits representing the redundancy of the message.

The redundant bits are initially set to "0".

For each selected payload bit at "1", the separate impulse response is rotated as a function of the position of the "1" bit concerned, and the value obtained is added modulo 2 to the redundancy of the message being generated.

A third aspect of the invention provides a method of decoding data corresponding to the form of encoding previously described and in which, for a given cycle, the decoding starts at a robust location, with a relatively high likelihood, and terminates at a weak location, with a weak likelihood, ignoring the concept of time. The likelihood of the location is computed over a number of symbols proportional to at least the constraint length K.

Decoding advantageously starts with computing the likelihood of the no-error hypothesis at the robust location (LR) chosen, and then the likelihoods with an increasing number of errors at the same location.

In some cases, the weakest location can be considered as the physical edges of the cycle.

The likelihood of a location is determined as a function of information on the quality of the local signal coming from the unit preceding the decoder. In the case of a demodulator, the quality of the local signal can be given by the reconstituted carrier on each symbol integrated over the duration of the associated decoding hypothesis.

For information, the reconstituted carrier coming from the demodulator qualifies the quality of the signal (its amplitude) over the minimum possible duration (one symbol) and relative to the carrier phase and frequency parameters estimated by the demodulator. The carrier parameters are estimated in the demodulator over the total duration of the packet P when it is short or over a duration corresponding to the propagation variation time constants in the case of long packets or in the case of the continuous stream.

In the case of a convolutional internal decoder upstream of the present cyclic convolutional decoder, the likelihood of the location is determined by the likelihood associated with the decoding hypothesis of the upstream decoder.

Decoding is effected progressively in two opposite directions (F1 and F2) to converge on two sides of a weak location (LF), each direction giving a respective set of hypotheses.

Moreover, decoding continues symbol by symbol toward the weak location (LF), by increasing the duration of the likelihood associated with the hypothesis, retaining on each step the hypotheses with the greatest likelihood.

A total hypothesis, chosen as being that which satisfies the equations of the control system step by step throughout the cycle, is produced from these hypotheses.

The hypothesis retained is that with the maximum likelihood.

The proposed solution is based on independent, separate and looped encoding of each portion of the data packets to be transmitted. A portion is called a "cycle" and includes a particular number of payload bits. If the separate impulse response of a cycle of given length exists, it is unique. The cycle lengths for which no separate impulse response can be found are those corresponding to $(2^{K-1}-1)$, where K is the constraint length of the code. The lengths of the cycles are parameters that can be set as required and can be short (of the order of 60 bits for R=1/2), enabling them to be concatenated to adapt them to any type of packet.

The following description covers only transmission of separate packets, it being clear that these teachings are easy for the person skilled in the art to transpose to communication in the form of a continuous stream of data.

The proposed decoding method minimizes the bursts of errors generated by ignoring the time factor: the most robust location of the cycle is looked for, in order to start decoding, and the weakest location, in order to stop decoding.

For large packets, the division into cycles eliminates the propagation of errors within the packet, since the cycles are independent by construction.

Accordingly, differing from the conventional packet encoding technique, in which a convolutional code which evolves, i.e. which has a beginning but no predetermined ending, the invention aims to make judicious use of the cycle structure so that a maximum number of operations is executed in each cycle, preferably until the decoding of the internal code is finalized. This leads to modifying the algebraic structure of the convolutional code.

An algebraic structure is used for this which is derived from the algebraic structure of the standard convolutional code. In a standard convolutional code, there is a sliding scalar product that always cancels out. In the context of the invention, the sliding scalar product that always cancels out is looped.

FIG. 3 is a block diagram of one embodiment of an approach of this kind conforming to the invention, in the context of a system for sending and receiving data in the form of packets analogous to that of FIG. 1. For conciseness, only differences of design and operation compared to the FIG. 1 system are described.

A framed structure is established from the external coder as far as the modulator in the sender and from the demodulator as far as the external decoder in the receiver. The cycle frame is the same size as a modem packet or smaller.

Thus the convolutional code does not constitute an aperiodic structure imposing constraints on the design implementation using functional subdivision. The functional subdivision usually leads to the definition of an interface with a limited number of bits on the CV+RS "weighted" stream (as a general rule three or four bits are used for soft decoding).

In the context of the invention, the temporal division of tasks into packets associated with the modem means that parallel processors can be allocated to the processing of the packets (in the packet receiver 8) when the transmission bit rate necessitates this, without separating the demodulator function from the internal decoder function. Accordingly this embodiment of the invention uses soft decoding on 16 bits.

Another benefit of the invention lies in the fact that since the cycle structure is completely disjoint temporally, there is a much greater resistance to scrambling, since there is no propagation of errors.

If the initialization of the decoder system is lost at a given time, with a continuous algebraic structure, it takes a very long time to find the correct decoding hypothesis again. On the other hand, if the algebraic structure is implemented over a single cycle, a loss of initialization leads at most to the loss of only this cycle, which can be recovered by techniques known in the art (for example by the external code).

In the case of a cyclic convolutional encoder (cycle size from 10 to 1 500, K=7, R=1/2) and sixth degree generator polynomials, it has been found that decoding performance, for packet lengths from 60 bits, is in the final analysis as good as the theoretical performance on a continuous stream, without the risk of packets of errors exceeding 60 bits, as observed in a conventional implementation. The error rate increases for large cycles (for example cycles larger than 1 000 bits), of course. The phenomenon whereby the error rate increases again becomes increasingly significant as the constraint length K increases: thus although the BER of a cycle of 100 bits is at a minimum for the (K=9, R=1/2) code, the error rate of the same code at 250 bits is significantly higher.

A concrete embodiment of the invention is described next, touching on the three phases of transmitting and receiving a message in the form of a radio frequency packet using a frequency hopping technique (see, for example, FIGS. 2 and 3) and a convolutional code (C=100, K=7, R=1/2) and polynomials of degree K−1=6:

encoding a unit message, or computing the separate impulse response, general encoding of the message, and weighted decoding.

Encoding a unit message, or computing the separate impulse response.

The payload data to be transmitted can be represented by a vector X whose members are entire series. The encoded data transmitted can be represented in the same manner by a vector Y whose members are entire series. The encoded data is linked to the payload data by a finite matrix relation. The members of the matrix G that define this standard operation are generator polynomials. It can be shown that the matrix G leads to the existence of control matrices H such that H.Y=0. Constituting a solution of this equation constitutes a necessary and sufficient condition for Y to be a word of the code, i.e. there exists an X such that G.X=Y. The control matrices H constitute a class of equivalence, some elements of which provide stepwise separate encoding having the same performance as hereinabove. The matrix written H.Y=0 can be put into the form of mathematical equations which constitute a system of general control equations from which the sliding control system of the invention is derived.

Figure 5:
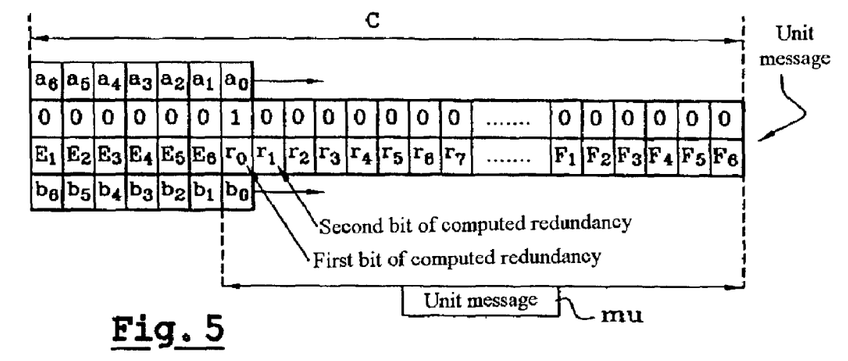
FIG. 5 is an example of computing a separate impulse response coded in accordance with the invention.

FIG. 5 shows, in the form of a table of bits, one example of the composition of the separate impulse response of a unit message MU.

The unit message MU is a message of u bits (u being the number of payload bits of the cycle consisting of one "1" bit and (u−1) "0" bits).

Because of the payload/redundancy data separation, the separate impulse response of this unit message includes the incident unit message and the succession of associated redundant bits r0, r1, . . . r20 . . . F1, . . . F6.

In accordance with the invention, a sequence of bits is added upstream of the unit message MU, in this example six bits E1 to E6. The value of the set of bits E1 to E6 of the sequence is chosen so that the separate impulse response of the whole formed by this set of these bits E1 to E6 followed by the redundant bits r0, r1, . . . r20 yields, for the last six bits F1 to F6 of the separate impulse response, the same successive values as those of the successive bits E1 to E6. The redundant bits are transmitted only once.

In other words, a combination of "0" and "1" values is determined for the sequence of bits E1 to E6 added on the upstream side so as to obtain, after the separate impulse response is computed, the following conditions for the corresponding bits: E1=F1, E2=F2, E3=F3, E4=F4, E5=F5 and E6=F6. When these conditions are satisfied, the looping conditions are satisfied, i.e. the control equation system is verified.

Before the separate impulse response is computed, the unit message MU advantageously comprises a single bit whose binary value is "1", the complement of the message consisting of bits whose binary value is "0".

To determine the correct combination of bits E1 to E6 that yields the looping conditions, an exhaustive search is advantageously used in preference to an algebraic method. The choice relies on the fact that there is only a relatively small number of unknown redundant bits (six in this instance), and that it is sufficient to try them all ($2^6$ possibilities) to determine the only ones that loop.

To be more specific, all possible combinations of the bits E1, E2, . . . , E6 are scanned, each time computing the redundant bits r0, r1, r2, . . . r7, up to the bits F1, F2, . . . F6, until the combination is obtained that satisfies the conditions E1=F1, E2=F2, E3=F3, E4=F4, E5=F5 and E6=F6.

Of course, the number of redundant bits El, etc. added upstream of the unit message can be other than six, depending on the system of control equations used.

Encoding is effected by control polynomials having a number K of coefficients. In this example, the parameters are as follows:

number K of coefficients of control polynomials: 7, i.e. K=7, and ratio R of numbers of data bits and bits transmitted: 1/2, i.e. R=1/2.

Here the encoding process is specified by the parameters K and R previously cited, stated in the form (K, R), i.e. (7, 1/2) for this instance.

The coefficients of the control polynomials are expressed by the bits a0, a1, . . . , a6 and b0, b1, . . . , b6, respectively identified on the top and bottom lines of the FIG. 5 table.

General encoding of the message.

General encoding of the message starts by computing a separate impulse response, i.e. a unit message is encoded cyclically. Then, the linear structure of the code adds (modulo 2) separate impulse responses correctly offset to encode the whole of the message: the MU is typically shifted cyclically to make its "1" bit correspond to the "1" bit of the message to be encoded, after which the redundancies of the MU shifted in this way are added to the preceding redundancy of the message (modulo the length of the cycle), and the redundancies of the message are initialized to 0 at the start of the process.

In practice, the separate impulse response is computed beforehand and stored, because it does not vary if the same system of control equations and the same cycle length are retained. This impulse response, when it exists, is unique.

The applicant has found and demonstrated that in the case of R=1/2, looping is possible for all cycle sizes except for multiples of $2^{K-1}-1$, where K−1 is the degree of the control polynomials. For example, in the particular case K=7, it is not possible to loop messages whose size is a multiple of $2^6-1=63$. However, this has virtually no impact in practice, since it is easy to concatenate cycles of different length to adjust to the required message length.

Weighted decoding.

Figure 6:
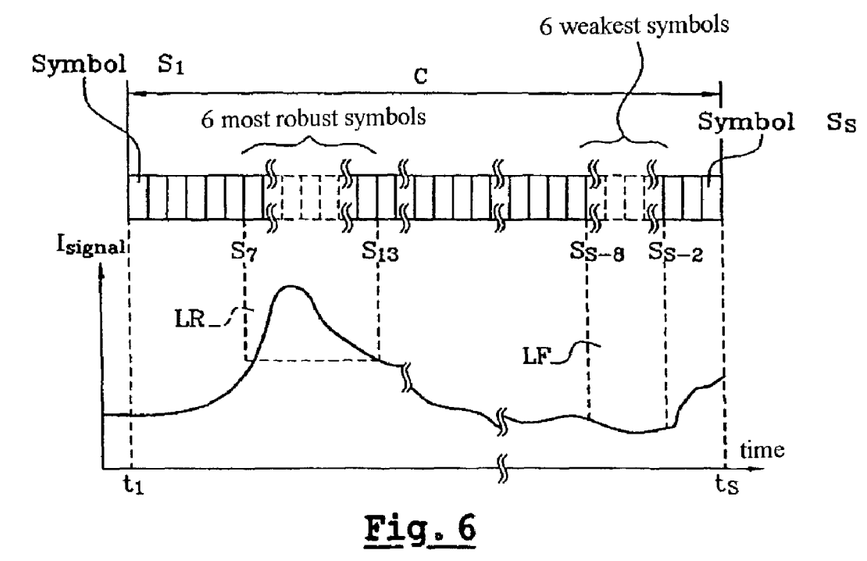
FIG. 6 is a diagram showing the principle of identifying robust locations and fragile locations of a cycle with respect to the quality of the signal used in the context of decoding in accordance with the invention.

FIG. 6 shows a cycle from a received packet, the cycle comprising a number s of symbols, for example 64 symbols, the first symbol S1 being received at a time t1, and the last symbol Ss being received at a time ts.

Underneath the representation of this cycle is shown the evolution over time [t1, ts] of the amplitude of the reconstituted carrier. This amplitude fluctuating over this interval, it is possible to establish a group of successive bits, formed of 2×6 bits in the case of (7, 1/2) encoding, situated on a portion of high amplitude relative to the rest of the reconstituted carrier signal for the cycle. In the example shown, the group comprises 12 bits belonging to the six symbols S7 to S13 (the modulation is QPSK modulation in the example, but this is not limiting on the invention, which can be implemented with other forms of modulation). In accordance with the invention, these bits, located at the most robust location LR, constitute the starting point for decoding. When decoding starts from the output of another convolutional decoder, the likelihood estimation start interval can be longer than 2×6 bits.

Similarly, there exists a group of at least 2×6 bits in a portion of low amplitude relative to the rest of the signal. In this example, the group at the weakest location LF comprises the symbols Ss-8 to Ss-2.

Compared to other weighted decoding processes, the time aspect is completely ignored in the case of cycles. The concept of time no longer has any implications for weighted decoding. In other words, the starting point of the decoding can be chosen arbitrarily. Thus a cycle can be stored in a memory and the least favorable location looked for, relative to the structure of the signal or of the transmission system, in order to start decoding. The most robust location LR of the cycle is advantageously looked for, i.e. the location with the highest likelihood or the maximum amplitude of the weighted signal received. It can be estimated that if, over the next (k−1) symbols (for example), the amplitudes are high, the probabilities of error on these bit are at a minimum, statistically speaking, compared to another location at which the signal is of lower amplitude.

Figure 7:
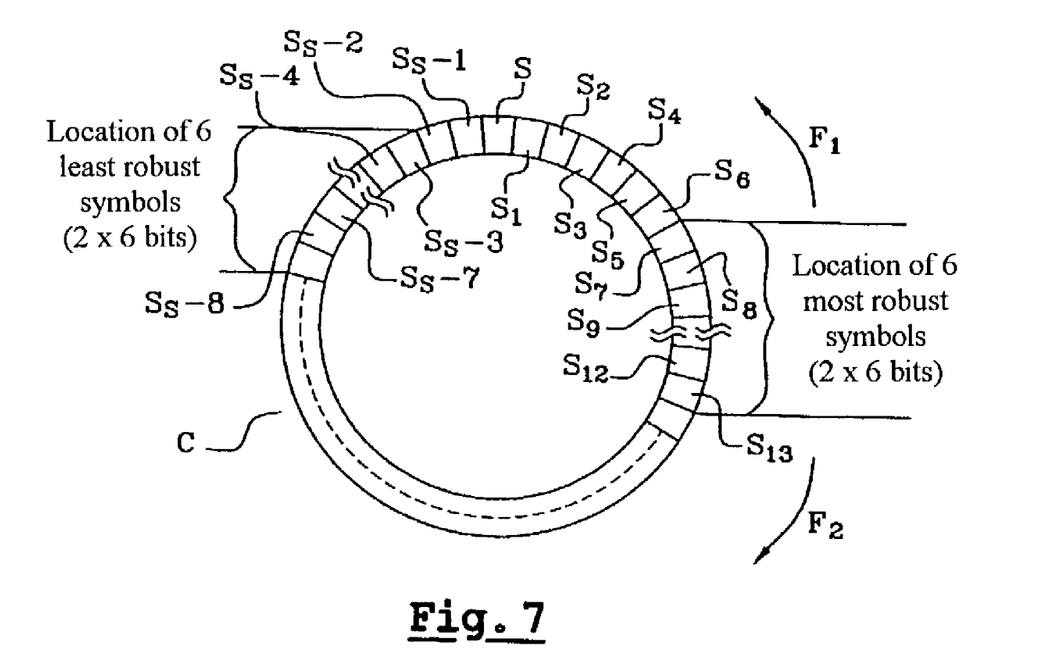
FIG. 7 is a diagram showing the concepts, used in decoding, of looping the bits of a cycle and of the decoding path from a robust location to a fragile location.

To carry out the decoding operation, the symbols S1 to Ss are treated as if they were distributed around a circle, with the symbol S1 adjacent the symbol Ss, in accordance with this looping, as shown in FIG. 7. This means that the starting point can be chosen arbitrarily in time, whilst retaining the order of succession of the symbols of the cycle.

When the decoding conditions have been determined in this way, stepwise decoding is begun, starting from the sides. The approach being based on the circle concept, decoding proceeds in opposite directions: counterclockwise (arrow F1) and clockwise (arrow F2), from the most robust location LR of the symbols S7 to S13, and until convergence is achieved, toward the weakest location LF comprising the least robust symbols Ss-8 to Ss-2, the latter constituting the point of convergence.

During circular decoding, the weakest location, i.e. the least favorable location LF, is never passed over completely. There is therefore less chance of losing the correct hypothesis because of passing over the least favorable location. Similarly, passing over intermediate unfavorable locations can be avoided when it is possible to exploit the redundancy of another corrector code applying to the same data (permutated, for example) and the latter proves to be more beneficial.

The decoding routes in the two directions F1 and F2 are usually not equal, since the least favorable location LF has no a priori reason to be diametrically opposite the most robust location LR. Weighted decoding is effected step by step, and consists of extending the applicability of the most likely hypotheses, which therefore have the largest reconstituted carrier. The duration of the integration of the likelihood of the hypothesis increases by one symbol on each step. The number of better hypotheses retained is typically of the order of 300 in this instance.

In the general case, there are several favorable starting locations, one of which is preferred, and one highly unfavorable location. If a highly unfavorable location is found to be adjacent or contiguous to one side of the most favorable location, decoding starts from the other side and proceeds on a single path.

When an extreme situation is encountered in which the very favorable location is surrounded on either side by unfavorable locations, a slightly less favorable but better situated location can be looked for at that time.

On converging from the most robust location LR toward the weakest location LF, a set of hypotheses is obtained for each direction of advance toward the convergence, i.e. from the left and from the right (arrows F1 and F2). A "total" hypothesis is produced from these two sets of hypotheses (left and right). The chosen total hypothesis is the one that verifies the system of step by step control equations throughout the cycle. In other words, the right and left hypotheses adopted, from which that with the greatest likelihood is then chosen, are those which have the same starting point, and even the same point of arrival (and which therefore loop).

Note from the foregoing that the time factor can be ignored over a cycle. Decoding proceeds in the following manner:

choice of the most "robust" location LR: strongest consecutive likelihood indices of 2×6 bits (in the (7, 1/2) case), in place: computation of the likelihood of the no-error hypothesis in this zone, and then those with 1, 2, 3, etc. errors, extension along the cycle and on either side (arrows F1 and F2) of the most robust location LR, symbol by symbol, retaining on each step the hypotheses with the greatest likelihood, final looping to the weakest location LF of the (effective) cycle.

This embodiment establishes the robustness of the data on the basis of the amplitude of the reconstituted signal. However, any other information could be considered that would indicate the quality of the signal and thereby identify the portions with high error rates, for example, using the output of convolutional codes sent in parallel or concatenated, exploiting the results of the interleaved external codes.

Furthermore, the encoding/decoding method scrambles some or all of the transmitted bits of the cycle for statistical or secrecy reasons, without degrading performance.

The method of the invention can be implemented by programmed means based on processors, by hardwired logic, or by intermediate technological solutions. It divides the tasks to be executed temporally rather than functionally. Thus it integrates the demodulator and the cyclic convolutional coder into the packet receiver and eliminates the quantization defined by the data interface between the demodulator and the decoder. There is no degradation of performance of the weighted decoding due to the quantization of its input.

The type of encoding and decoding described is advantageous even for the usual transmission conditions.

During experiments carried out by the applicant, it was observed that performance was optimized for the code K=7, R=1/2 with cycles of more than 60 bits and fewer than 1 000 bits and for the (9, 1/2) code with cycles of more than 100 bits and fewer than 250 bits For large packets, the division into cycles eliminates the propagation of errors since the cycles are independent by construction.

The invention was developed with separate loop encoding. The benefit of separate encoding is easier decoding without reducing the correction capacity of the code. This is because:

firstly, there is no need for the final operation of regenerating the data in the decoder 16, and secondly, the robustness of the system is improved: if the decoding capacity is exceeded, the incident stream can be transmitted without correction, rather than applying erroneous corrections.

The recommended decoding limits and minimizes error packets within the cycle.

The number of cycles for which looping is impossible is sufficiently small not to create system constraints.

The computation power necessary is similar to the non-looped situation.

Moreover, the demonstration of possible looping accurately quantifies the size of the functional cycles, without inverting the matrix.

There is no limit as to the choice of control polynomials since the invention is not at all dependent on the choice of generated polynomials. The size and the value of the generated polynomials are arbitrary. For example, good results are obtained in the following cases of values for the pair (K, R): (7, 1/2) (given example)<(7, 3/4), (9, 1/2) and (9, 3/4). Simulations can be carried out using digital techniques and a pseudo-random noise generator.

The invention claimed is:

1. A method of convolutionally encoding bitstream comprising payload bits, said method comprising the steps of submitting said bitstream to a convolutional encoder corresponding to a system of sliding control equations of finite length, looped on itself, and encoding said bitstream in accordance with said system of equations to obtain an encoded bitstream comprising output bits.

2. The method claimed in claim 1, wherein said output bits comprise redundant bits concatenated with said payload bits.

3. The method claimed in claim 1 further comprising grouping said output bits over one or more looped portions forming one or more respective cycles.

4. The method claimed in claim 3 further comprising defining each of said cycles by the following quadruplet of parameters:
   the cycle size C (expressed as a number of bits transmitted),
   the number K of payload bits with which the control system is concerned at any given time, said number K being the constraint length so that (K−1) is the maximum degree of the polynomials associated with said system of control equations,
   the redundancy R, i.e. the ratio of the number of payload bits to the number of transmitted bits of the cycle, and
   the coefficients of the equations of the control system.

5. The method claimed in claim 4 further comprising selecting said cycle parameters independently from one cycle to another.

6. The method claimed in claim 3 wherein said cycles are encoded independently, even if they belong to the same user set, and are therefore decoded independently, with no exchange of data or parameters between cycles.

7. The method claimed in claim 3, said method further comprising a step of scrambling some or all of the output bits of a cycle.

8. The method claimed in claim 3 wherein each cycle includes a small number of bits, for example from 64 bits to 150 bits for the combination (K=7, R=1/2), in order to minimize the propagation of errors and guarantee resistance to intentional or non-intentional interference.

9. The method claimed in claim 1 further comprising grouping one or more cycles into separate digital packets in order to service a transmission of packets, if necessary, continuous transmission being a special case of a single packet of arbitrary length.

10. The method claimed in claim 1 further comprising adapting the quality of service (cycle loss rate, average error rate and transmission time-delay) to the nature of the data to be processed by adapting the variable parameters of each cycle to the level of encoding and decoding, said quality of service being individualized according to the nature of said data (voice, digital data, signaling, header, etc.).

11. The method claimed in claim 1, when implemented on one or more processors employing temporal division rather than functional division of the tasks to be carried out, with no passing of data between cycles, the cycles being independent, integrating demodulation and cyclic convolutional decoding in the same processor with reduction of the quantizing loss that can be induced by the data interface between a conventional demodulator and a conventional decoder.

12. The method claimed in claim 1, wherein, when used for encoding an incoming message, said method comprising the successive steps of:
   computing the separate impulse response corresponding to the size C of a cycle to be encoded, and
   encoding the incoming message.

13. The method claimed in claim 12 wherein said encoding employs a separate impulse response computed from a unit message.

14. The method claimed in claim 13 wherein said unit message comprises a set of bits of which only one bit has the binary value "1".

15. The method claimed in claim 12 comprising computing said impulse response using a sequence of redundant bits placed before the start of the unit message, the value of the bits forming said sequence being selected so that, after said impulse response is computed, there is the same sequence of values in the corresponding last bits of said impulse response.

16. The method claimed in claim 15 comprising the step of computing the value of said redundant bits by trying all possible combinations of bit values until said sequence of values is obtained in the last bits of said unit message after said impulse response is computed.

17. The method claimed in claim 12 wherein said encoding further comprises general encoding of data by rotation and addition of said separate impulse response computed from said unit message.

18. The method claimed in claim 12 comprising the step of precomputing said separate impulse response for each type of cycle and wherein said impulse response, if it exists, is unique.

19. The method claimed in claim 18 comprising concatenating cycles of selected sizes to prevent non-looping cycle sizes and adjust to the length of the required message.

20. A method of decoding cyclically coded data, in particular data coded by the encoding method claimed in claim 1, wherein, for a given cycle, said method comprises: starting decoding at a robust location with a relatively high likelihood and terminating at a weak location with a weak likelihood, ignoring the direction of the flow of time, the likelihood of the location being computed over a number of symbols proportional at least to the constraint length K.

21. The method claimed in claim 20, wherein when used with a single cyclic encoder, said decoding starts at the most robust location and terminates at the weakest location of the cycle to be decoded.

22. The method claimed in claim 20 wherein the likelihood of a location is determined as a function of the quality of the local signal coming either from the demodulator (for example the carrier reconstituted over each symbol, integrated over the duration of the associated decoding hypothesis) or from the output of another internal convolutional decoder or another external block decoder.

23. The method claimed in claim 20 comprising starting said decoding by computing the likelihood of the no-error hypothesis in the chosen robust location as well as the hypotheses having a limited number of errors at the same place.

24. The method claimed in claim 20 wherein said decoding is progressive in two opposite directions to progress on both sides of a weak location, each direction yielding a respective set of hypotheses.

25. The method claimed in claim 20 comprising continuing said decoding demodulated symbol by demodulated symbol toward said weak location by increasing the duration of the likelihood associated with the hypothesis, retaining on each step the hypotheses with the greatest likelihood.

26. The method claimed in claim 25 comprising producing a total hypothesis, chosen as being that which satisfies the equations of the control system step by step throughout the cycle, from said hypotheses.

27. The method claimed in claim 20 comprising retaining the hypothesis with the maximum likelihood.

28. A sender including an encoder configured to implement the encoding method claimed in claim 1.

29. A receiver including a decoder configured to implement the decoding method claimed in claim 1.

30. A method of convolutionally decoding an input bitstream comprising an encoded bitstream, said method comprising the steps of submitting said bitstream to a convolutional decoder corresponding to a system of sliding control equations of finite length, looped on itself, and decoding said bitstream in accordance with said system of equations to obtain a decoded bitstream.

31. The method claimed in claim 30, wherein said input bitstream comprises redundant bits concatenated with said payload bits.

32. The method claimed in claim 30 further comprising grouping bits of said input bitstream over one or more looped portions forming one or more respective cycles.

33. The method claimed in claim 32 wherein said cycles are decoded independently, even if they belong to the same user set, with no exchange of data or parameters between cycles.

34. The method claimed in claim 30 further comprising adapting the quality of service (cycle loss rate, average error rate and transmission time-delay) to the nature of the data to be processed by adapting variable parameters of each cycle to the level of decoding, said quality of service being individualized according to the nature of said data (voice, digital data, signaling, header, etc.).

* * * * *